United States Patent
Arai et al.

(10) Patent No.: US 7,638,839 B2
(45) Date of Patent: Dec. 29, 2009

(54) POWER SEMICONDUCTOR DEVICE AND POWER CONVERSION DEVICE USING THE SAME

(75) Inventors: Taiga Arai, Mito (JP); Mutsuhiro Mori, Mito (JP)

(73) Assignee: Hitachi, Ltd., Tokyo (JP)

( * ) Notice: Subject to any disclaimer, the term of this patent is extended or adjusted under 35 U.S.C. 154(b) by 282 days.

(21) Appl. No.: 11/684,044

(22) Filed: Mar. 9, 2007

(65) Prior Publication Data

US 2008/0217649 A1 Sep. 11, 2008

(51) Int. Cl.
*H01L 29/739* (2006.01)
(52) U.S. Cl. .............................. 257/331; 257/E29.198
(58) Field of Classification Search ......... 257/327–331, 257/578, 583, 591, E29.197, E29.198
See application file for complete search history.

(56) References Cited

U.S. PATENT DOCUMENTS 6,683,343 B2 * 1/2004 Matsudai et al. ............ 257/328

2004/0207009 A1 * 10/2004 Yamaguchi et al. ......... 257/329

FOREIGN PATENT DOCUMENTS

| JP | 2000-307116 | 11/2000 |
| JP | 2000-311998 | 11/2000 |

* cited by examiner

*Primary Examiner*—Minh-Loan T Tran
*Assistant Examiner*—W. Wendy Kuo
(74) *Attorney, Agent, or Firm*—Antonelli, Terry, Stout & Kraus, LLP.

(57) ABSTRACT

A power semiconductor device having a low loss and a high reliability and a power conversion device using the power semiconductor device are provided. In the power semiconductor device, a plurality of MOS type trench gates are positioned to be spaced by at-least two types of intervals therebetween, a low-resistance floating $n^+$ layer is positioned on a main surface of a semiconductor substrate adjacent to a floating p layer positioned between the adjacent MOS type trench gates having the broad interval to achieve consistency between a low output value and a high breakdown resistance.

14 Claims, 14 Drawing Sheets

----- ELECTRON CURRENT
BOUNDARY LINE BETWEEN X AND
Y USING THE CENTRAL LINE OF
A GATE ELECTRODE AS A REFERENCE

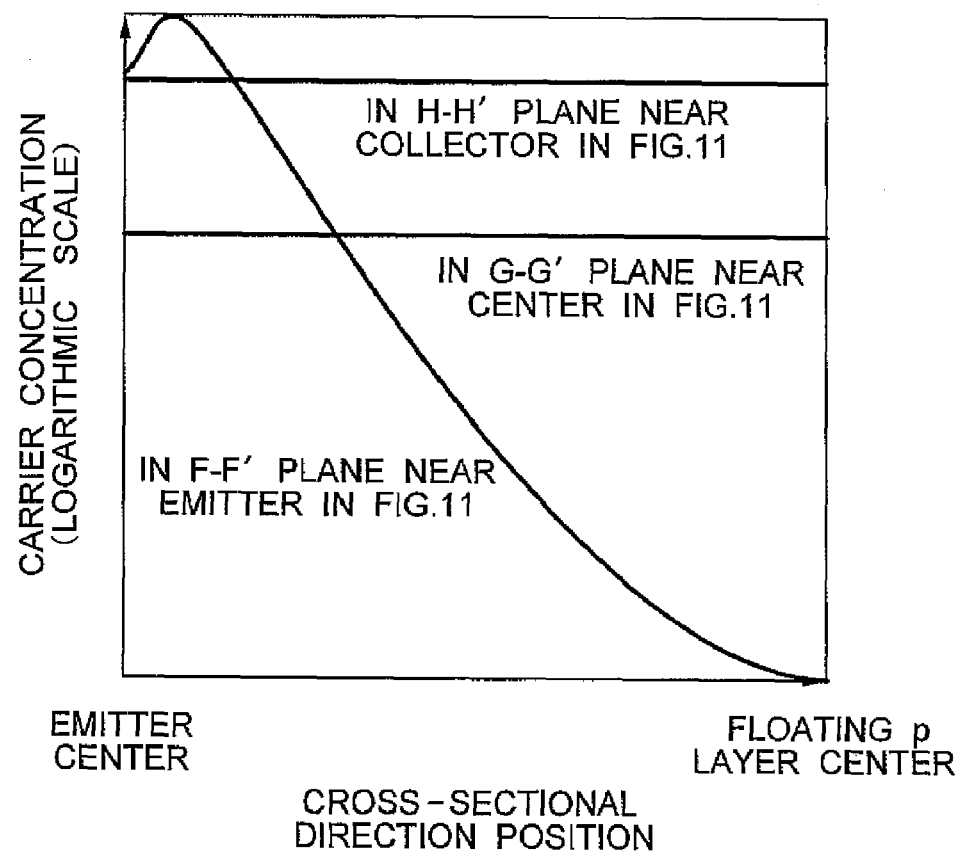

POWER SEMICONDUCTOR DEVICE AND POWER CONVERSION DEVICE USING THE SAME

BACKGROUND OF THE INVENTION

The present invention relates to a power semiconductor device and a power conversion device using the power semiconductor device.

An insulated gate bipolar transistor (which will be abbreviated to the IGBT, hereinafter) is an switching element which controls a current flowing between a collector electrode and an emitter electrode with use of a voltage applied to a gate electrode. The IGBT has a controllable power range of from tens of watts to hundreds of thousands of watts, and also has a switching frequency as broad as from tens of Hertz to over a hundred Hertz. Taking advantage of this feature, the IGBT is widely used from a domestic small-power appliance such as an air conditioner or a microwave oven to a large-power apparatus such as an inverter in railway or an ironworks.

In order to attain a high efficiency of a power conversion device or the like to which the IGBT is applied, the IGBT is required to reduce its loss. To this end, various measures have been taken. The loss includes a conduction loss, a turn-on loss, and a turn-off loss. A voltage generated between the collector electrode and the emitter electrode in the ON state of the IGBT is called an ON state voltage, which is used as an index for making the ON state voltage proportional to the conduction loss. Thus it becomes important in the IGBT to reduce the ON state voltage, the turn-on loss, and the turn-off loss.

FIG. 11 shows a cross-sectional structure of an IGBT 20 as a prior art cited in JP-A-2000-307116, Paragraph (0056). FIG. 11, reference numeral 500 denotes a collector electrode, numeral 100 denotes a p layer contacted with the collector electrode 500 with a low contact resistance, 112 denotes an n layer having a carrier concentration lower than the p layer 100, 110 denotes an n⁻ drift layer having a carrier concentration lower than the n layer 112, 120 denotes a channel p layer, 121 denotes a p⁺ layer, 125 denotes a floating p layer, 130 denotes an n⁺ layer, 600 denotes an emitter electrode contacted with the p⁺ layer 121 and with the n⁺ layer 130 with a low contact resistance, 300 denotes a gate insulated film, 200 denotes a gate electrode, 401 denotes an insulating film, 501 denotes a collector terminal, 601 denotes an emitter terminal, and 201 denotes a gate terminal.

The IGBT of FIG. 11 corresponds to a general trench insulated gate type IGBT but which has a reduced number of the emitter electrodes 600 to shorten a gate width, thereby reducing a saturation current, suppressing a short-circuited current, and increasing a breakdown resistance. In the IGBT 20 of FIG. 11, further, the number of the emitter electrodes 600 is reduced and the floating p layer 125 is introduced, so that part of a Hall current flows through the floating p layer 125 into an emitter. As a result, a Hall concentration in the vicinity of the emitter is increased, the resistance is decreased, thus reducing the ON state voltage.

Many devices as improved thyristors having ON state voltages lower than the IGBT but hard in switch control are reported. A MOS-gated emitter switched thyristor (referred to merely as EST, hereinafter), a MOS controlled thyristor (referred to merely as MCT, hereinafter), and a base resistance controlled thyristor (referred to merely as BRT, hereinafter) are widely known. In recent years, an insulated gate turn-off thyristor (referred to merely as IGTO, hereinafter) is proposed.

FIG. 12 shows an IGTO 30 having a current saturation capability as cited in JP-A-2000-311998, Paragraphs (0013) to (0016), FIG. 2. The IGTO 30, as shown in FIG. 12, has a structure of a combination of a thyristor and an IGBT. In the IGTO, a device base has an anode electrode 72 having an anode terminal 61, a P⁺ layer 71, and an N⁻ drift layer 70. A deep trench gate has a gate terminal 60 having a gate electrode 73, a conductive material 74, an oxide walls 75, 76, 77. The deep trench gate is provided in the device base. Also provided on the trench gate are a P⁻ base 69, a P⁺ layer 68, an upper-side angled N⁺ layer 67, and a cathode electrode 66 having a cathode terminal 62, which are disposed around the trench gate. As a result, the IGBT is formed. On the other hand, the thyristor has a P⁻ base 65, an N⁺ layer 64, and an oxide layer 63. A shallowly-doped P channel 78 are provided under the trench gate. In the IGTO 30, the thyristor is turned on by turning on the IGBT, so that the operation of the thyristor achieves the ON state voltage.

However, the IGBT 20 shown in FIG. 11 (JP-A-2000-307116, Paragraph (0056)) or the IGTO 30 shown in FIG. 12 (JP-A-2000-311998, Paragraphs (0013) to (0016), FIG. 2) has a problem which follows. It has been found in the IGTO 30 of FIG. 11 that, as the width of the floating p layer 125 is increased to reduce the saturation current, the ON state voltage increases. The inventors of this application has located through detailed analysis of their calculation that the major cause of the problem comes from the fact that electric charges within the IGBT are unevenly distributed. FIG. 13 shows a calculation result of a charge concentration distribution (linear scale) when charges pass through an E-E' sectional plane in FIG. 11. Since a charge concentration is reduced in the vicinity of the emitter, this emitter region has a high resistance, thus increasing the ON state voltage. FIG. 14 shows calculation results of charge concentration distributions (logarithmic scale) when charges between an F-F' plane in the vicinity of the emitter in FIG. 11, a G-G' plane in the center portion between the emitter and the collector, and between an H-H' plane in the vicinity of a collector, respectively. In the vicinity of the emitter, a region of the floating layer away from the emitter electrode has an extremely-reduced charge concentration. Since the saturation current is reduced, it is required to improve uneven charges for the purpose of spreading the width of the floating P layer.

In the IGTO 30 of FIG. 12, when two thyristors are formed between the IGBTs as an example, a lower forward voltage drop is provided and the current saturation function is made less effective, which is disclosed in JP-A-2000-311998, Paragraph (0034). In other words, the JP-A-2000-311998 indicates even in the IGTO 30 of FIG. 12 that the reduction of the ON state voltage is inconsistent with the increase of the breakdown resistance based on the current saturation function.

SUMMARY OF THE INVENTION

It is therefore an object of the present invention to provide a reliable semiconductor device having a low loss and also a power conversion device using the semiconductor device.

The above problem is solved by providing a semiconductor device having such a structure as described below and also a power conversion device using the semiconductor device. More specifically, the semiconductor device includes a semiconductor substrate having a pair of main surfaces, a first semiconductor region of a first conduction type adjacent to one of the main surfaces of the semiconductor substrate and positioned within the semiconductor substrate, a second semiconductor region of a second conduction type adjacent to the first semiconductor region and having a carrier concentration lower than a carrier concentration of the first semiconductor region, a plurality of MOS type trench gates having at least two sorts of intervals thereof extended from the other main surface into the second semiconductor region, a third semiconductor region of the first conduction type provided between the MOS type trench gates and having a carrier concentration higher than a carrier concentration of the second semiconductor region, a fourth semiconductor region of the second conduction type provided between the adjacent MOS type trench gates having a narrow interval therebetween to be positioned within the third semiconductor region and to be contacted with the MOS type trench gate and having a carrier concentration higher than a carrier concentration of the third semiconductor region, a fifth semiconductor region of the second conduction type provided between the adjacent MOS type trench gates having a broad interval therebetween to be positioned within the third semiconductor region and to be contacted with the MOS type trench gates and having a carrier concentration higher than a carrier concentration of the third semiconductor region, a first electrode provided between the adjacent MOS type trench gates having the narrow interval to be contacted with the third and fourth semiconductor regions, and a second electrode contacted with the first semiconductor region, wherein a ratio B/A of a width A between the adjacent trench gates including the fourth semiconductor region with respect to a width B between the adjacent trench gates including the fifth semiconductor region is made equal to or larger than two. The power conversion device is only required to use the aforementioned semiconductor device.

The semiconductor device of the present invention further has a sixth semiconductor region of the first conduction type positioned between the third semiconductor region and the fifth semiconductor region and having a carrier concentration higher than the carrier concentration of the third semiconductor region.

In accordance with the present invention, there can be achieved a power conversion device such as in an inverter system which can increase a reliability while avoiding increase of the conduction loss of an IGBT and thus can increase its efficiency.

BRIEF DESCRIPTION OF THE DRAWINGS

FIG. 14 shows calculation results of charge concentration distributions when charges pass through respective cross-sectional planes extended in a horizontal direction in FIG. 11.

DETAILED DESCRIPTION OF THE EMBODIMENTS

The present invention will be explained in detail with reference to the attached drawings.

Embodiment 1

Figure 1:
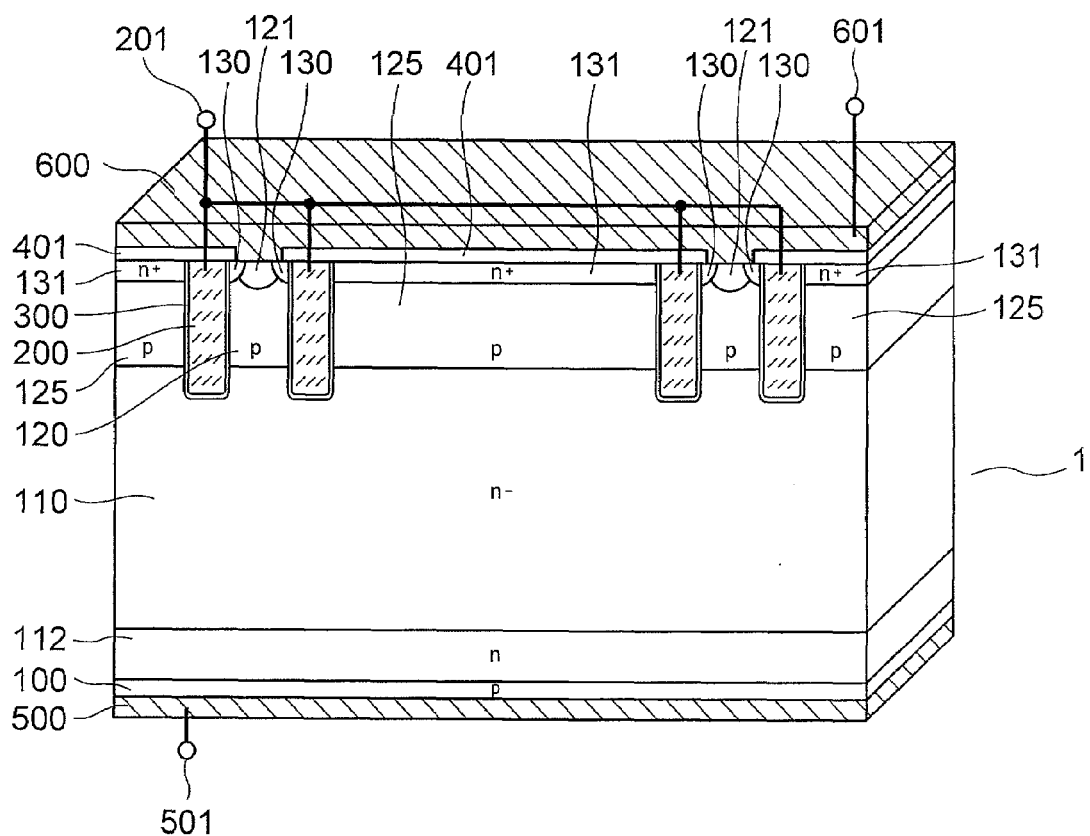
FIG. 1 shows a cross-sectional structure of a semiconductor device in accordance with an embodiment 1.
Figure 11:
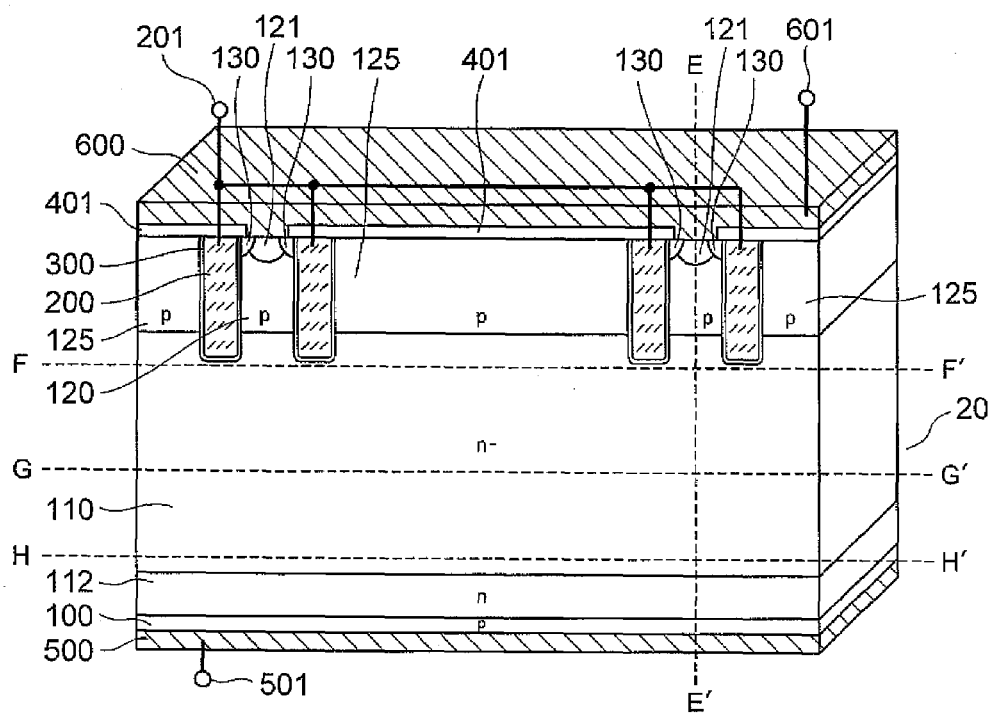
FIG. 11 shows a cross-sectional structure of a prior art IGBT.

FIG. 1 shows a cross-sectional structure of a semiconductor device 1 in accordance with the present embodiment. In FIG. 1, constituent elements having substantially the same functions as those in FIG. 11 are denoted by the same reference numerals or symbols. In FIG. 1, reference numeral 131 denotes a floating $n^+$ layer having a resistance lower than the floating p layer 125 and having a resistance lower therethan. The semiconductor device shown in FIG. 1 is featured in that the floating $n^+$ layer 131 is newly added within the floating p layer 125 of FIG. 11 and that the width of the floating p layer 125 is made wider for the purpose of reducing a saturation current.

Figure 2:
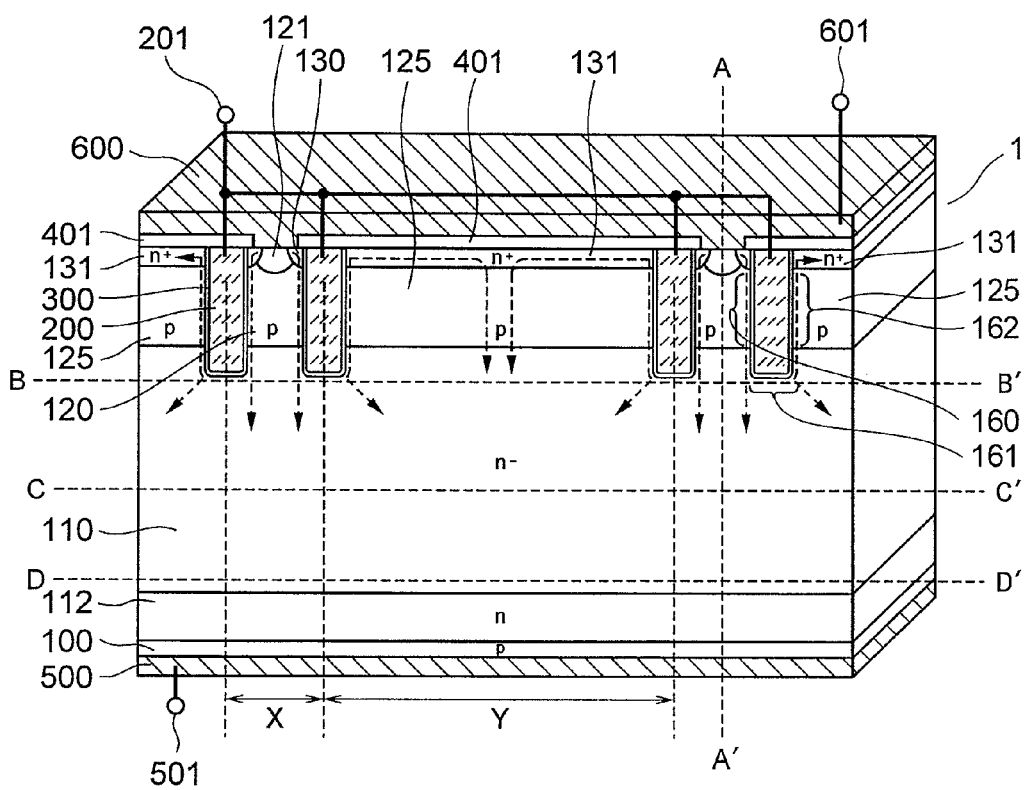
FIG. 2 shows a cross-sectional structure of the semiconductor device of the embodiment 1, for explaining the principle of its operation.

FIG. 2 shows the operation of the semiconductor device having the structure of FIG. 1. When a sufficiently large positive voltage is applied between a gate electrode and an emitter electrode, a channel inversion layer 160, an accumulation layer 161, and an inversion layer 162 are formed. When a positive voltage is applied between the collector electrode and the emitter electrode, electrons are injected into the n– drift layer 110 from the $n^+$ layer 130 via the channel inversion layer 160. As a result, the resistance of the n– drift layer 110 is made low by conductivity modulation, with a result that a conductive state is put between the collector and the emitter. At this time, a leakage current flows from the $n^+$ layer 130 through the channel inversion layer 160, the accumulation layer 161, and the inversion layer 162 to the floating $n^+$ layer 131, and further flows from the floating $n^+$ layer to the n– drift layer 110. In addition, since the farther than the emitter electrode a position is located the higher potential the position has in the floating p layer 125, the leakage current flows, in particular, from a position farther than the emitter electrode. As a result, charges in the vicinity of the emitter of the n– drift layer 110 are distributed evenly and thus a charge concentration is increased.

Figure 3:
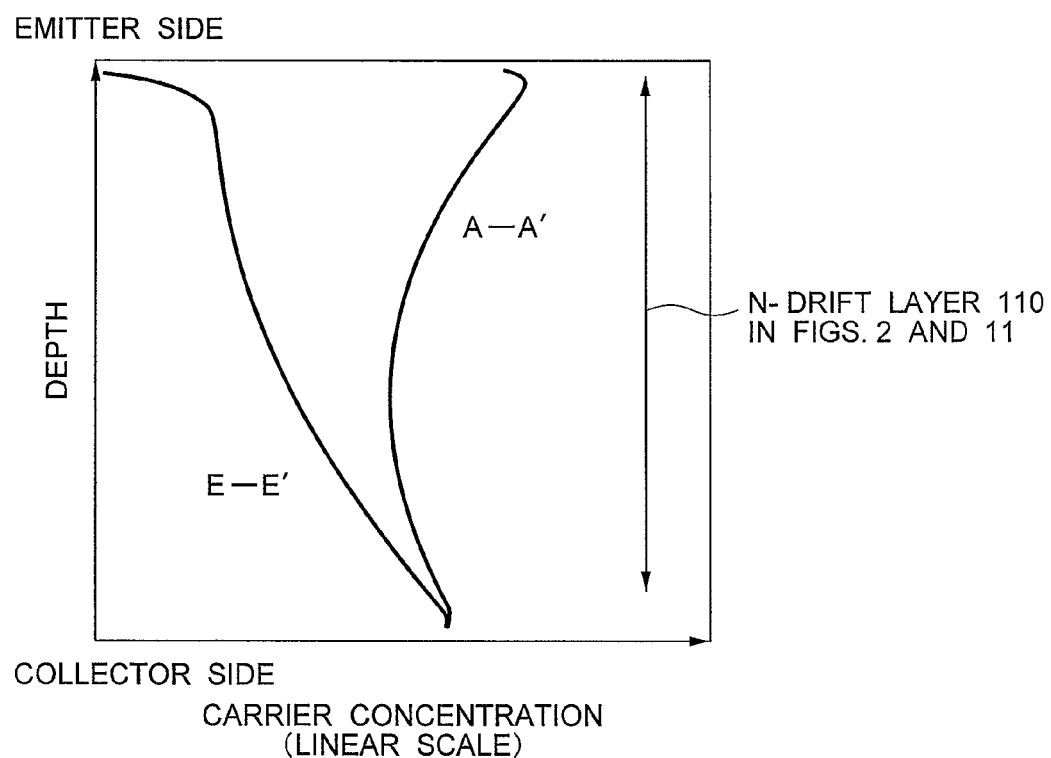
FIG. 3 shows calculation results of charge concentration distributions when charges pass through an A-A' plane in FIG. 2 and through E-E' plane in FIG. 11, respectively.

FIG. 3 shows calculation results of cross-sectional charge concentration distributions (linear scale) when charges pass through an A-A' plane in FIG. 2 and between an E-E' plane in FIG. 11. As shown in FIG. 3, when compared with the IGBT of FIG. 11, the IGBT of the present embodiment of FIG. 2 has a remarkably-higher charge concentration in the vicinity of the emitter and the reduction of the resistance of the n– drift layer 110 is promoted. As a result, the ON state voltage of the semiconductor device of the present embodiment is reduced. In a range shown by the double headed arrow in FIG. 3, the n– drift layer 110 in FIGS. 2 and 11 is located.

In the IGBT of FIG. 2, as the collector voltage is made much higher, the potential of the floating p layer 125 becomes the threshold and higher, with the result that the inversion channel 162 disappears and the leakage current flowing through the floating $n^+$ layer 131 is stopped. The IGBT as the power semiconductor device of the present embodiment of the FIG. 2 exhibits a saturation characteristic similar to the IGBT shown in FIG. 11. That is, when the width of the floating p layer 125 is made wider, the density of the saturation current is suppressed and a short-circuit resistance is increased.

Assume now as shown in FIG. 2 that reference symbol X denotes a width between the adjacent trenches having the emitter electrode, i.e., a width between the central lines of the gate electrodes 200 as shown in FIG. 2, and that symbol Y denotes a width between the adjacent trenches having the floating p layer 125, i.e., a width between the central lines of the gate electrodes 200 as shown in FIG. 2. The gate width is inversely proportional to (X+Y) and the saturation current is nearly proportional to the gate width. Thus when compared with the absence of the floating p layer 125 or or when Y=0, the saturation current can be reduced to ⅓ or less when Y/X≧2. In this way, in the present embodiment of FIGS. 1 and 2, the reduction of the ON state voltage is consistent with the suppression of the saturation current in the IGBT.

Figure 4:
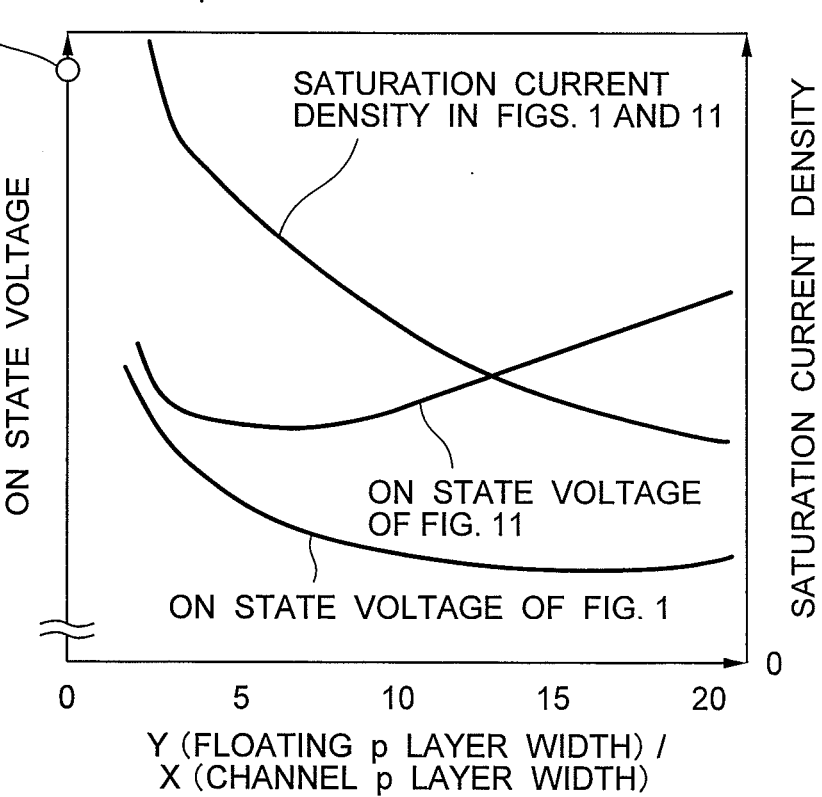
FIG. 4 shows calculation results of an ON state voltage and a saturation current depending on the width of the floating p layer 125 in the embodiment 1 and in the prior art of FIG. 11.

FIG. 4 is an exemplary graph showing calculation results with Y/X in abscissa and the ON state voltage in ordinate. Even in the prior art IGBT of FIG. 11 and in the IGBT of the present embodiment of FIG. 1, the saturation current density in the prior art is equal to that in the present embodiment as shown in FIG. 4. As will been seen from FIG. 4, in the structure of the present embodiment of FIG. 1 when compared with the structure of FIG. 11, the saturation current is not changed but only the minimum value of the ON state voltage is shifted to a region having a large Y/X. That is, in the structure of FIG. 1, the ON state voltage can be made low and the saturation current can also be suppressed when compared with the structure of FIG. 11. It can be confirmed from our calculation that the IGBTs of low to high breakdown voltage types exhibit similar merits to the above, and that the IGBT of the high breakdown voltage, in particular, requiring more saturation current suppression becomes effective.

Figure 12:
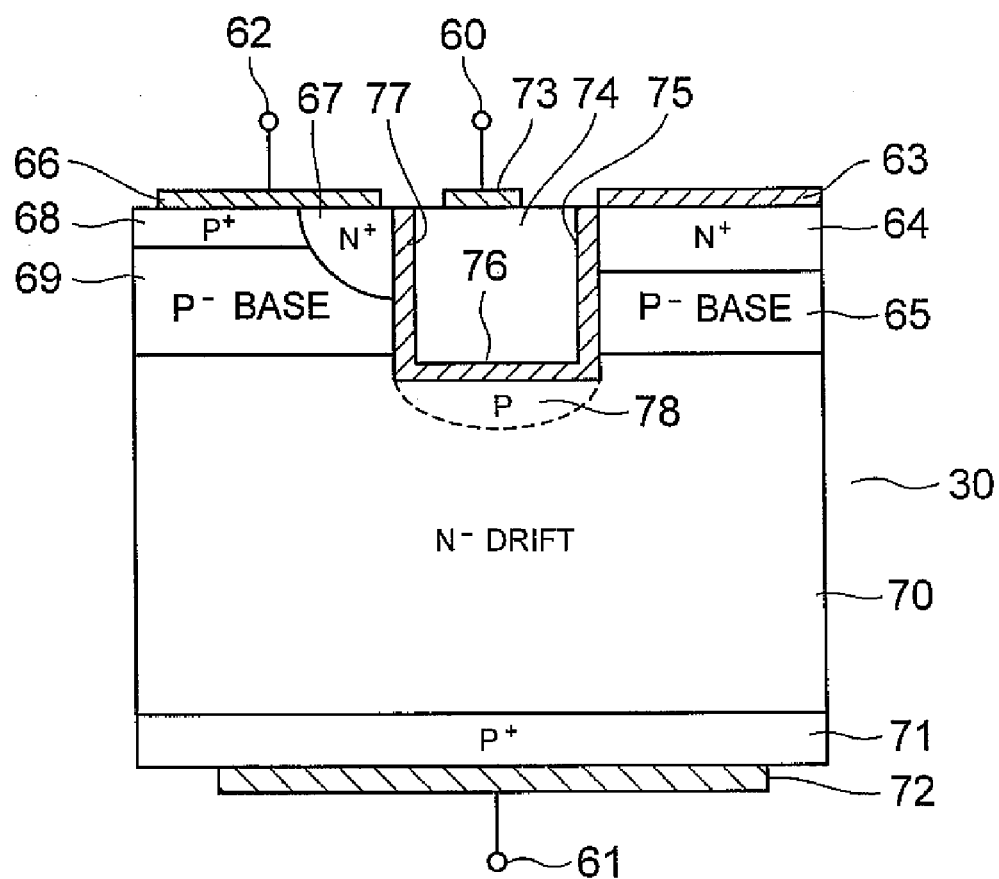
FIG. 12 shows a cross-sectional structure of another prior art IGTO.
Figure 13:
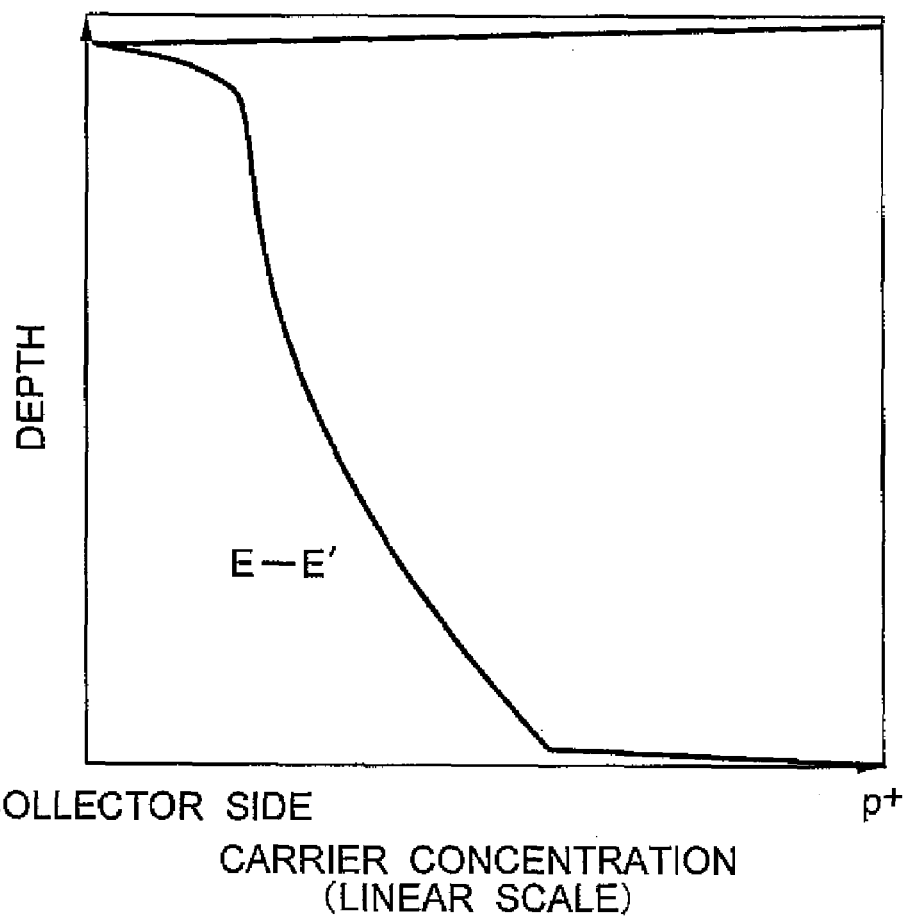
FIG. 13 shows a calculation result of a charge concentration distributions when charges pass through an E-E' plane in FIG. 11.

This structure is operated as the IGBT, so that, in the conductive state, most of the current flows through an pnp transistor between the collector and the emitter. In all the operational states including the conductive state of the structure of the present embodiment, a part of this structure corresponding to the thyristor as the prior art IGTO 30 of FIG. 12 is not operated as a thyristor. The leakage current flowing from the floating $n^+$ layer via the floating p layer to the $n^-$ drift layer is not larger than a current necessary for holding latch-up of the thyristor and the thyristor remains in the OFF state. In such a structure as to turn on the thyristor, there may possibly occur a electric field concentration in the EST as cited in "Proc. of the 6th Internat. Symposium on Power Semiconductor Device & IC's", 1994, pp. 195. However, the structure of the present embodiment can avoid the above risk.

The planar layout of the floating $n^+$ layer 131 is only required to be widely conductive so that a charge concentration under the floating p layer 125 becomes even. Thus, the shape of the cross section of the floating $n^+$ layer is not limited to that having a uniform continuous structure shown in FIG. 1. Even when the floating $n^+$ layer has one or a plurality of intermittent cross sections with or without conductive layers connecting them or having mixture of those layers, substantially the same effects can be obtained even for such a shape or fringe having a plurality of discontinuous parts as to have a lattice or contact formed conductive in the planar layout. In the structure of the present embodiment, in order to obtain the effects of the present structure, the wider the width of the floating p layer 125 is made the smaller the gate capacity per gate width is and the smaller the switching loss is.

For the purpose of further reducing a loss in the structure of the present embodiment, the maximum value of the carrier density of the p layer 100 in FIG. 1 is set to be 10-100 times the maximum value of the carrier density of the n layer 112. As a result, the turn-off loss can be reduced. When the total carrier density is from $1 \times 10^{12}$ cm$^{-2}$ to $1 \times 10^{13}$ cm$^{-2}$, the effects can be more effective. And it is desirable that the thickness of the p layer 100 be not larger than 3 μm.

With such an arrangement, the quantity of carriers injected from the collector side during the conductive state can be suitably suppressed, the carrier density remaining in the collector side upon turn-off can be reduced, the turn-off loss can be reduced to quickly stop the current. As a result, consistency can be advantageously achieved between the reduction of the ON state voltage and the suppression of the saturation current in the emitter-side structure. In such a structure, it is desirable to apply a metal containing a p type impurity to the collector electrode, and in particular, it is preferable to use aluminum as the p type impurity. This is effective for avoiding the fact that, in the above structure, the surface concentration of the p layer 100 contacted with the collector electrode 500 is reduced and the contact resistance is increased. The inventors of this application have confirmed from results of their experiments that, the loss of the semiconductor device can be reduced, and the short-circuit resistance of the power conversion device can be secured without involving any trouble even in electrical contact with the p layer 100 of a low concentration.

The structure of the present embodiment can be realized by an existing IGBT process. Further, the floating $n^+$ layer 131 can be simplified using a process common to the $n^+$ layer 130 and the floating $P^+$ layer can be simplified using a process common to the $p^+$ layer 121. The base structure of the IGBT is not limited to such a stripe type as shown in FIG. 1. For example, an existing layout such as a mesh structure may be applied to the IGBT. Further, the IGBT may have a p channel MOS structure opposed to an n channel MOS structure as in the present embodiment.

Embodiment 2

Figure 5:
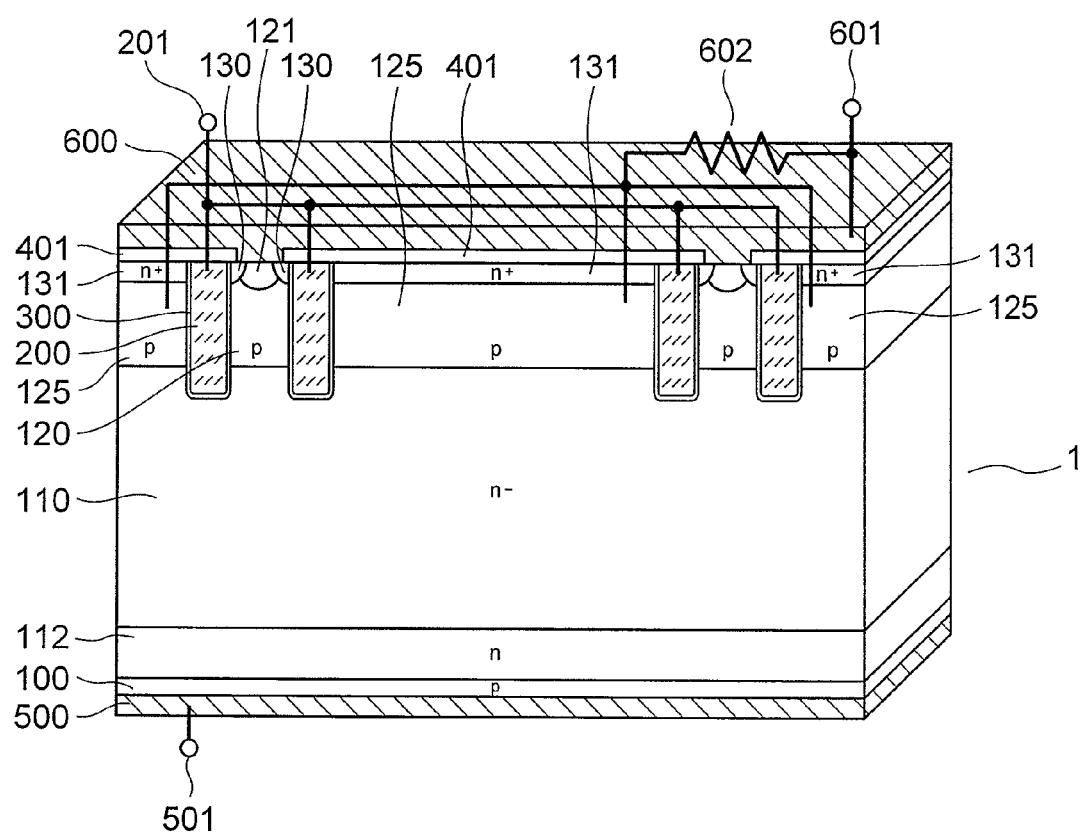
FIG. 5 is a cross-sectional structure of a semiconductor device in accordance with an embodiment 2.

FIG. 5 shows a cross-sectional structure of a semiconductor device 1 in accordance with the present embodiment. In FIG. 5, constituent elements having substantially the same functions as those in FIG. 1 are denoted by the same reference numerals or symbols. In FIG. 5, reference numeral 602 denotes a resistance. The semiconductor device 1 of the present embodiment of FIG. 5 is arranged so that the floating p layer 125 in the structure of FIG. 1 is made conductive with the emitter terminal 601. With this structure, since the capacitive feedback between the gate and the collector is reduced, a capacitance charging time upon turn-on is shortened and the loss is reduced. This structure will also have an effect of suppressing the operation of a parasitic thyristor made up of the p layer 100, the n layer 112, the n– drift layer 110, the floating p layer 125, and the floating $n^+$ layer 131, because the potential of the floating p layer 125 is near to that of the emitter. The contact of the floating p layer 125 can be achieved by partially removing the floating $n^+$ layer 131 to directly form an electrode, or through another diffusion layer contacted with the floating p layer 125, or through the peripheral region or the internal region of these devices. Or the contact of the floating p layer 125 can be achieved by a plurality of continuous or discontinuous contacts. Further, the conduction between the floating p layer 125 and the emitter electrode 600 is attained through a certain value of the resistance 602, whereby charges passing through the floating p layer 125 can be suppressed from going directly to the emitter electrode and an increase in the charge concentration under the floating p layer 125 can be held. The resistance 602 to be used in this example is not specifically limited, so long as the floating p layer is such an on-chip resistance as a diffusion layer or polysilicon contacted with the floating p layer 125 or such a resistor as an external resistance. The resistance 602 is used desirably by adjusting the resistive value on a balance between the aforementioned effects of the reduced ON state voltage by the resistance 602, the reduced capacitive feedback and the suppressed operation of the parasitic thyristor.

Even the present embodiment can obtain effects similar to the embodiment 1, and even the modification example and the optimum conditions described in the embodiment 1 can obtain similar effects.

Embodiment 3

Figure 6:
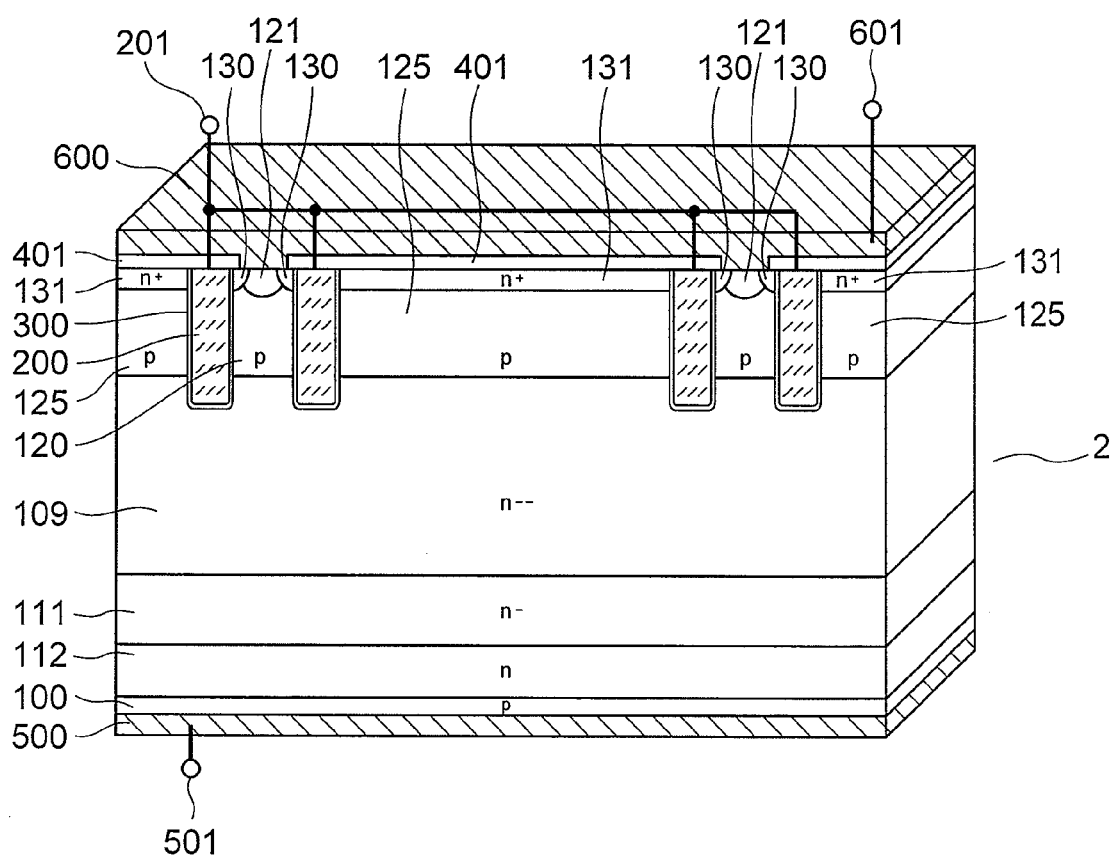
FIG. 6 is a cross-sectional structure of a semiconductor device in accordance with an embodiment 3.

FIG. 6 shows a cross-sectional structure of a semiconductor device 2 in accordance with the present embodiment. In FIG. 6, constituent elements having substantially the same functions as those in FIG. 1 are denoted by the same reference numerals or symbols. In FIG. 6, reference numeral 111 denotes an $n^-$ layer having a carrier concentration lower than the n layer 112, and numeral 109 denotes an $n^{--}$ drift layer 109 having a concentration lower than the $n^-$ layer 111.

The structure of FIG. 6 is featured in that an $n^-$ layer 111 is added to the structure of FIG. 1 and the n– drift layer 110 in FIG. 1 is replaced with the $n^{--}$ drift layer 109 having a higher resistance. In this structure, as in the embodiment 1, effects of the reduction of the ON state voltage and the suppression of the saturation current on the emitter side can be obtained and further noise can be suppressed from being generated. That is, in the structure of FIG. 6, a depletion layer is extended from an interface between the channel p layer 120 and the $n^{--}$ drift layer 109 to the $n^{--}$ drift layer 109 and reaches the $n^-$ layer 111 upon turn-off. Since the $n^-$ layer 111 has a long life time and has a resistance lower than the $n^{--}$ drift layer 109, the extension of the depletion layer is suppressed and thus the depletion layer fails to reach the n layer 112 having a short carrier life time. In the structure of FIG. 6, accordingly, since carriers do not disappear abruptly and the current does not stop abruptly, an inductance in the circuit causes no generation of a large jump voltage with di/dt and thus noise caused by the jump voltage can be suppressed from being generated.

Further, the thickness of the $n^-$ layer 111 is set to be larger than that of the n layer 112 and the thickness of the $n^{--}$ drift layer 109 is set to be larger than the $n^-$ layer 111, so that an electric field intensity at an interface between the $n^{--}$ drift layer 109 and the channel p layer 120 is reduced and the breakdown voltage is improved. In a semiconductor device having a breakdown voltage, in particular, not smaller than about several kV, it is known that its destruction frequency by cosmic ray becomes high. However, the present embodiment has similar effects even for the purpose of increasing a cosmic ray resistance, and this structure is advantageous in increasing the breakdown voltage. It has also been confirmed that the effect of increasing the breakdown voltage caused by the increased thickness of the layer is effective even when the carrier concentrations of the p layer 100 and the n layer 112 are high.

In a semiconductor device having a low breakdown voltage and requiring no consideration to the cosmic ray resistance, the thickness of the entire substrate between the collector and the emitter can be made smaller and the conductive loss can be reduced, by making the thickness of the $n^-$ layer 111 larger.

Even the structure of the present embodiment can obtain effects similar to the embodiment 1 and even the modification example and the optimum conditions described in the embodiment 1 can obtain similar effects. When the structure of the embodiment 2 is applied, the structure of the embodiment 2 can obtain effects similar to the above.

Embodiment 4

Figure 7:
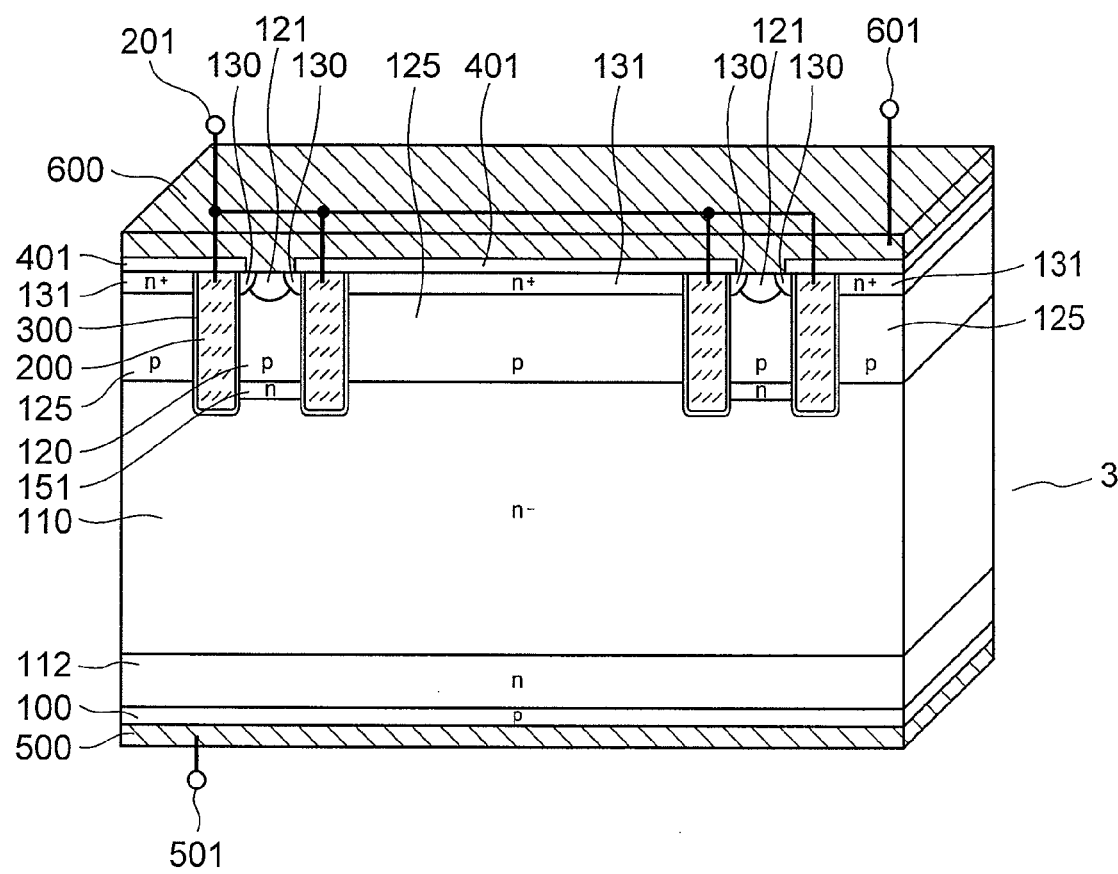
FIG. 7 is a cross-sectional structure of a semiconductor device in accordance with an embodiment 4.

FIG. 7 shows a cross-sectional structure of a semiconductor device 3 in accordance with the present embodiment. In FIG. 7, constituent elements having substantially the same functions as those in FIG. 1 are denoted by the same reference numerals or symbols. In FIG. 7, reference numeral 151 denotes a charge barrier n layer having a carrier concentration higher than the n– drift layer 110. In the semiconductor device of the present embodiment shown in FIG. 7, the charge barrier n layer 151 is added in the structure of FIG. 1, and the presence of the charge barrier n layer 151 having a potential higher than the n– drift layer 110 causes holes flowing into the emitter to be correspondingly blocked. As a result, a hole concentration is increased in the vicinity of the emitter of the n– drift layer 110, the resistance is reduced, and the ON state voltage is reduced.

Even the structure of the present embodiment has effects similar to the embodiment 1 and even the modification example and the optimum conditions described in the embodiment 1 have similar effects. When the structures of the embodiments 2 and 3 are applied, these structures have effects similar to the above.

Embodiment 5

Figure 8:
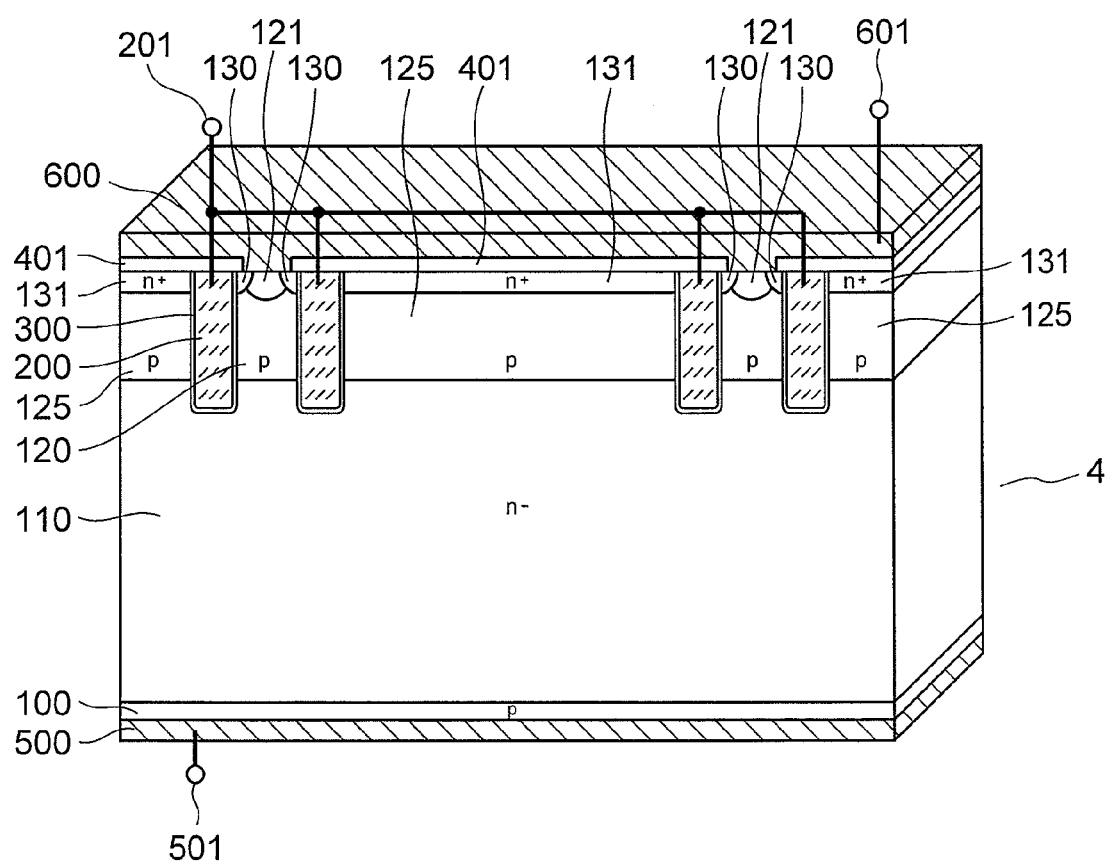
FIG. 8 is a cross-sectional structure of a semiconductor device in accordance with an embodiment 5.

FIG. 8 shows a cross-sectional structure of a semiconductor device 4 in accordance with the present embodiment. In FIG. 8, constituent elements having substantially the same functions as those in FIG. 1 are denoted by the same reference numerals or symbols.

In the semiconductor device of the present embodiment shown in FIG. 8, the n layer 112 is removed from the structure of FIG. 1, and a nonpunch-through type is applied when compared with the so-called punch-through type of FIG. 1. Even the present embodiment of the nonpunch-through type obtains effects similar to the embodiment 1, and even the modification example and the optimum conditions described in the embodiment 1 obtain similar effects. When the embodiment 2 and the embodiment 4 are applied to this structure, the structure can obtain effects similar to these embodiments.

Embodiment 6

Figure 9:
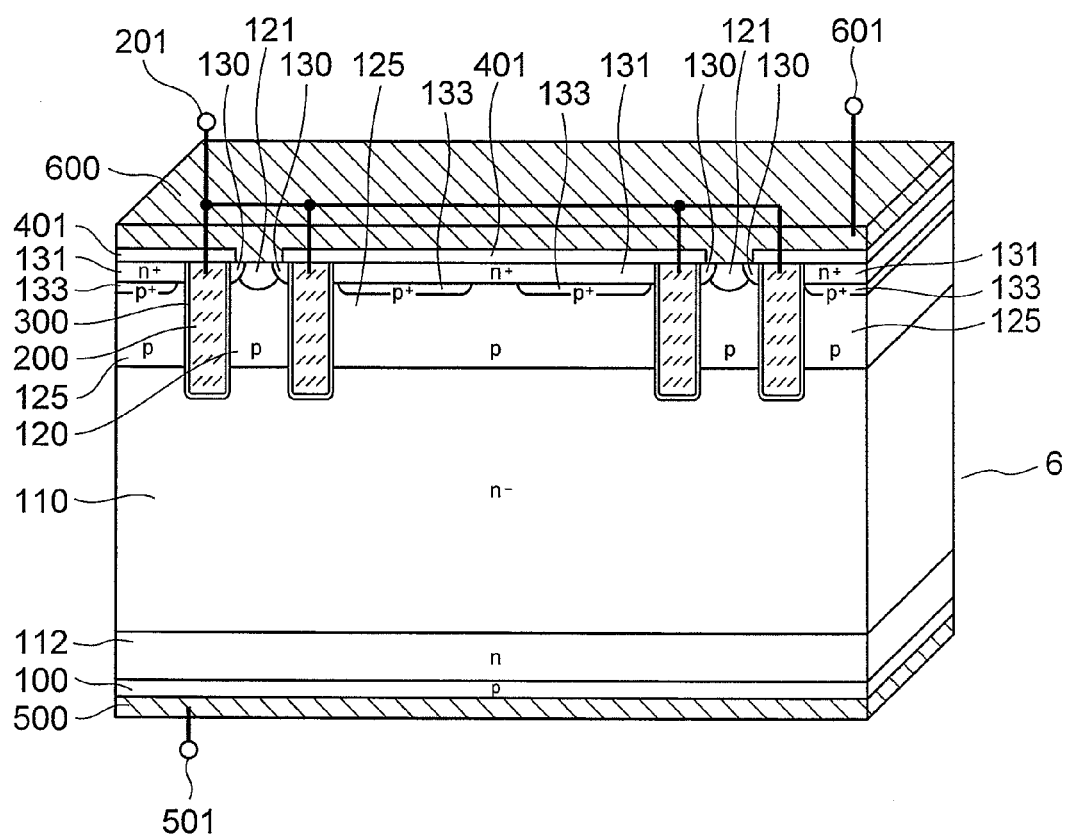
FIG. 9 is a cross-sectional structure of a semiconductor device in accordance with an embodiment 6.

FIG. 9 shows a cross-sectional structure of a semiconductor device 6 in accordance with the present embodiment. In the semiconductor device of the present embodiment shown in FIG. 9, constituent elements having the same functions as those in FIG. 1 are denoted by the same reference numerals or symbols. In FIG. 9, reference numeral 133 denotes a floating $P^+$ layer having a carrier concentration higher than the floating p layer 125.

In the semiconductor device 6 of the present embodiment shown in FIG. 9, the floating $n^+$ layer 131 having a low resistance and the floating $P^+$ layer 133 having a low resistance are newly added in the floating p layer 125 in FIG. 11, and the width of the floating p layer 125 is made longer to reduce the saturation current. The operation of this structure will be explained below. When a sufficiently-large positive voltage is applied between the gate electrode and the emitter electrode and a positive voltage is applied between the collector electrode and the emitter electrode, electrons are injected into the n– drift layer 110 from the n⁺ layer 130 through the channel inversion layer within the channel p layer 120. As a result, the resistance of the n– drift layer 110 is lowered due to the conductivity modulation, so that a conductive state is achieved from the collector to the emitter. At this time, electrons flow into the n– drift layer 110 from the n⁺ layer 130 through the inversion layer, accumulation layer, and the floating n⁺ layer 131 as a leakage current from a discontinuous part of the floating P⁺ layer. Meanwhile, positive holes flow from the collector side through the p layer 100, the n layer 112, and the n– drift layer 110, some of the holes from the floating p layer 125 through the low-resistance floating P⁺ layer 133 to the channel p layer 120, and thereafter holes flows through the p⁺ layer 121 to the emitter electrode 600. In the structure of the present embodiment shown in FIG. 9, when compared with the prior art IGBT 20 shown in FIG. 11, an electron current flowing through the floating n⁺ layer 131 and a hole current flowing through the floating P⁺ layer 133 cause a charge concentration distribution in the plane direction to be made even in the vicinity of the emitter of the n– drift layer 110, whereby a charge concentration in this region is improved. As a result, the reduction of the resistance of the n– drift layer 110 is enhanced and the ON state voltage is reduced.

The IGBT of the present embodiment shown in FIG. 9 exhibits saturation characteristic similar to the prior art IGBT 20 of FIG. 11. By making the width of the floating p layer 125 larger, the density of the saturation current is suppressed and the short-circuit resistance is increased. Assume as in FIG. 2 that X denotes a width between adjacent trenches having an emitter and Y denotes a width between adjacent trenches having the floating p layer 125. A gate width is inversely proportional to (X+Y) and a saturation current is nearly proportional to the gate width. Thus, when compared with a case where the floating layer is absent or Y=0, the saturation current can be reduced to ⅓ or less when Y/X≧2.

As has been explained above, the structure of FIG. 9 enhances effects of both the reduction of the ON state voltage and the suppression of the saturation current. The effects become more effective in a high-breakdown-voltage IGBT requiring more saturation current suppression. In the present structure, the larger the width of the floating p layer 125 is the smaller the gate capacitance per gate width is, thus reducing the switching loss. In the present embodiment, further, the presence of the floating P⁺ layer 133 tends to cause the potential distribution of the floating p layer 125 to become uniform. Since the potential of the floating p layer 125 in such a transition mode as the turn-off mode can advantageously be stabilized, a reliability can be increased.

As mentioned above, the present structure obtains effects similar to the embodiment 1, even the modification example and the optimum conditions described in the embodiment 1 obtain similar effects. When the structures of the embodiments 2, 3 and 4 are applied, effects similar to these embodiments can be obtained. The same effects holds true even for the embodiment 5.

Embodiment 7

Figure 10:
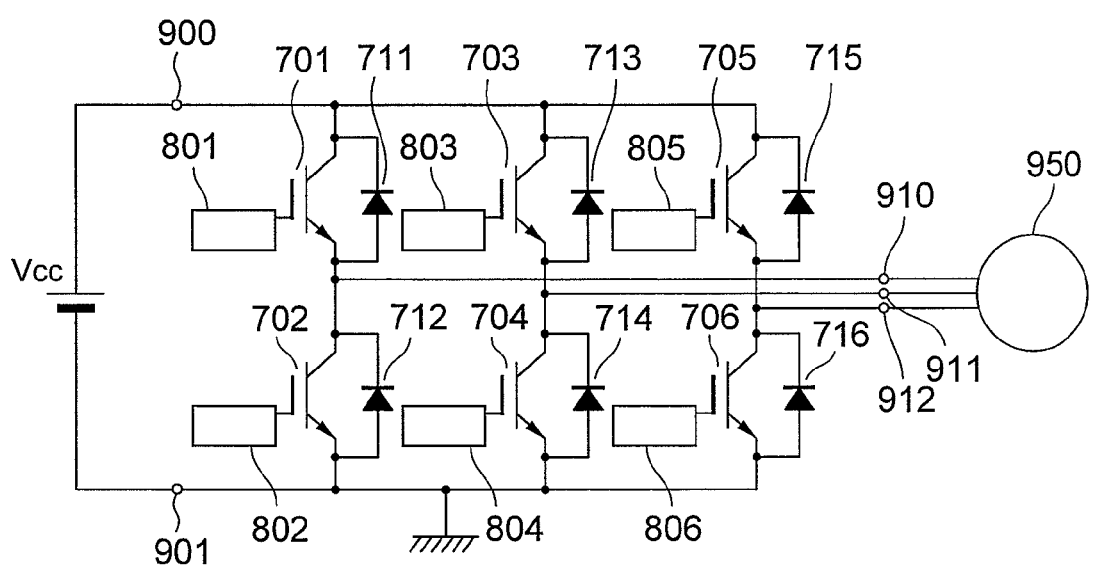
FIG. 10 is a circuit diagram of a power conversion device in accordance with an embodiment 7.

FIG. 10 shows an arrangement of an inverter device in accordance with the present embodiment. In the drawing, reference numerals 701 to 706 denote IGBTs, numerals 711 to 716 denote diodes, 801 to 806 denote gate circuits, 900 denotes a P terminal, 901 denotes an N terminal, 910 denotes a U terminal, 911 denotes a V terminal, 912 denotes a W terminal, and 950 denotes a motor.

The inverter device of the present embodiment shown in FIG. 10 is featured in that the structures described in the embodiments 1 to 6 are applied to the IGBTs 701 to 706. When the IGBTs of the embodiments 1 to 6 are applied to the inverter device of FIG. 10, the loss of the inverter device can be lowered and the reliability thereof can be increased. The arrangement of the inverter device of FIG. 10 is given only as an example. For example, such an inverter device may be provided that the switching elements and the diodes may be connected in inverse-polarity parallel to form parallel circuits, the parallel circuits are combined to be connected in series, and the parallel-series circuits are provided by the same number as the number of phases of an AC output. And even such an inverter device also exhibits similar effects. Although an inverter for converting a DC input to an AC output has been provided as a power conversion device in the present embodiment, the present invention is not limited to this specific example. For example, even a converter for converting an AC input to a DC output can achieve similar effects, which will be obvious to those skilled in the art, as a matter of course.

The invention claimed is:

1. A semiconductor device comprising:
   a semiconductor substrate having a pair of main surfaces, wherein said semiconductor substrate comprises:
   a first semiconductor region of a first conduction type adjacent to one of the main surfaces of the semiconductor substrate and positioned within the semiconductor substrate;
   a second semiconductor region of a second conduction type adjacent to the first semiconductor region and having a carrier concentration lower than a carrier concentration of the first semiconductor region;
   a plurality of MOS type trench gates having at least two sorts of intervals thereof extended from the other main surface into the second semiconductor region;
   a third semiconductor region of the first conduction type provided between the MOS type trench gates and having a carrier concentration higher than a carrier concentration of the second semiconductor region;
   a fourth semiconductor region of the second conduction type provided between the adjacent MOS type trench gates having a narrow interval therebetween to be positioned within the third semiconductor region and to be contacted with the MOS type trench gate and having a carrier concentration higher than a carrier concentration of the third semiconductor region;
   a fifth semiconductor region of the second conduction type provided between the adjacent MOS type trench gates having a broad interval therebetween to be positioned within the third semiconductor region and to be contacted with the MOS type trench gates and having a carrier concentration higher than a carrier concentration of the third semiconductor region;
   a first electrode provided between the adjacent MOS type trench gates having the narrow interval to be contacted with the third and fourth semiconductor regions: and
   a second electrode contacted with the first semiconductor region,
   wherein a ratio Y/X of a width X between the adjacent trench gates including the fourth semiconductor region with respect to a width Y between the adjacent trench gates including the fifth semiconductor region is made equal to or larger than two.

2. A semiconductor device according to claim 1, comprising a sixth semiconductor region of the second conduction type which is provided between said first and second semiconductor regions and which has a carrier concentration lower than a carrier concentration of said first semiconductor region and higher than a carrier concentration of said second semiconductor region.

3. A semiconductor device according to claim 2, wherein a maximum value of the carrier concentration of said first semiconductor region is 10-100 times a maximum value of a carrier concentration of said sixth semiconductor region.

4. A semiconductor device according to claim 2, comprising a seventh semiconductor region of the conduction type which is provided between said second and sixth semiconductor regions and has a carrier concentration higher than the carrier concentration of said second semiconductor region and lower than a carrier concentration of said sixth semiconductor region.

5. A semiconductor device according to claim 1, comprising an eighth semiconductor region of the second conduction type which is provided between said adjacent MOS trench gates having the narrow interval and is positioned between said second and third semiconductor regions to be adjacent to said MOS type trench gates, and which has a carrier concentration higher than the carrier concentration of said second semiconductor region.

6. A semiconductor device according to claim 1, wherein said third semiconductor region is provided between the adjacent MOS type trench gates having said broad interval, wherein said third semiconductor region includes a first portion and a second portion, the second portion to be contacted with said first electrode directly or through a resistance.

7. A semiconductor device comprising:
a semiconductor substrate having a pair of main surfaces, wherein said semiconductor substrate comprises:
a first semiconductor region of a first conduction type adjacent to one of the main surfaces of the semiconductor substrate and positioned within the semiconductor substrate;
a second semiconductor region of a second conduction type adjacent to the first semiconductor region and having a carrier concentration lower than a carrier concentration of the first semiconductor region;
a plurality of MOS type trench gates having at least two sorts of intervals thereof extended from the other main surface into the second semiconductor region;
a third semiconductor region of the first conduction type provided between the MOS type trench gates and having a carrier concentration higher than a carrier concentration of the second semiconductor region;
a fourth semiconductor region of the second conduction type provided between the adjacent MOS type trench gates having a narrow interval therebetween to be positioned within the third semiconductor region and to be contacted with the MOS type trench gate and having a carrier concentration higher than a carrier concentration of the third semiconductor region;
a fifth semiconductor region of the second conduction type provided between the adjacent MOS type trench gates having a broad interval therebetween to be positioned within the third semiconductor region and to be contacted with the MOS type trench gates and having a carrier concentration higher than a carrier concentration of the third semiconductor region;
a sixth semiconductor region of the first conduction type provided between said MOS type trench gates having the broad interval and positioned between said third semiconductor region and said fifth semiconductor region and having a carrier concentration higher than the carrier concentration of said third semiconductor region;
a first electrode provided between the adjacent MOS type trench gates having the narrow interval to be contacted with the third and fourth semiconductor regions: and
a second electrode collector electrode contacted with the first semiconductor region,
wherein a ratio Y/X of a width X between the adjacent trench gates including the fourth semiconductor region with respect to a width Y between the adjacent trench gates including the fifth semiconductor region is made equal to or larger than two.

8. A semiconductor device according to claim 7, comprising a seventh semiconductor region of the second conduction type which is provided between said first and second semiconductor regions and which has a carrier concentration lower than the carrier concentration of said first semiconductor region and higher than the carrier concentration of said second semiconductor region.

9. A semiconductor device according to claim 8, wherein a maximum value of the carrier concentration of said first semiconductor region is 10-100 times a maximum value of he carrier concentration of said seventh semiconductor region.

10. A semiconductor device according to claim 8, comprising, in place of said second semiconductor region being provided adjacent to said seventh semiconductor region, an eighth semiconductor region of the second conduction type which is provided between said second and seventh semiconductor regions and which has a carrier concentration higher than the carrier concentration of said second semiconductor region and lower than the carrier concentration of said seventh semiconductor region.

11. A semiconductor device according to claim 7, comprising a ninth semiconductor region of the second conduction type which is provided between said adjacent MOS type trench gates having the adjacent narrow interval and positioned between said second and third semiconductor regions to be contacted with said MOS type trench gates and which has a carrier concentration higher than the carrier concentration of said second semiconductor region.

12. A semiconductor device according to claim 7, wherein said third semiconductor region is provided between said adjacent MOS type trench gates having the narrow interval, wherein said third semiconductor region includes a first portion and a second portion, the second portion to be contacted with said first electrode directly or through a resistance.

13. A power conversion device comprising:
power conversion units equal in number to phases of an AC power;
a pair of DC terminals: and
AC terminals equal in number to the phases of the AC power,
wherein each of said power conversion units has two parallel circuits connected in series, said parallel circuits being connected between the pair of DC terminals, each of the parallel circuits having a switching element and a diode connected in inverse polarity thereto, interconnection points between said parallel circuits being connected to different AC terminals,
said switching element includes:
a semiconductor substrate having a pair of main surface, wherein said semiconductor substrate comprises;

a first semiconductor region of a first conduction type adjacent to one of the main surfaces of the semiconductor substrate and positioned within the semiconductor substrate;

a second semiconductor region of a second conduction type adjacent to the first semiconductor region and having a carrier concentration lower than a carrier concentration of the first semiconductor region;

a plurality of MOS type trench gates having at least two sorts of intervals thereof extended from the other main surface into the second semiconductor region;

a third semiconductor region of the first conduction type provided between the MOS type trench gates and having a carrier concentration higher than a carrier concentration of the second semiconductor region;

a fourth semiconductor region of the second conduction type provided between the adjacent MOS type trench gates having a narrow interval therebetween to be positioned within the third semiconductor region and to be contacted with the MOS type trench gate and having a carrier concentration higher than a carrier concentration of the third semiconductor region;

a fifth semiconductor region of the second conduction type provided between the adjacent MOS type trench gates having a broad interval therebetween to be positioned within the third semiconductor region and to be contacted with the MOS type trench gates and having a carrier concentration higher than a carrier concentration of the third semiconductor region;

a first electrode provided between the adjacent MOS type trench gates having the narrow interval to be contacted with the third and fourth semiconductor regions: and a second electrode contacted with the first semiconductor region, wherein a ratio Y/X of a width X between the adjacent trench gates including the fourth semiconductor region with respect to a width Y between the adjacent trench gates including the fifth semiconductor region is made equal to or larger than two.

14. A power conversion device comprising:

power conversion units equal in number to phases of an AC power;

a pair of DC terminals: and

AC terminals equal in number to the phases of the AC power, wherein each of said power conversion units has two parallel circuits connected in series, said parallel circuits being connected between the pair of DC terminals, each of the parallel circuits having a switching element and a diode connected in inverse polarity thereto, interconnection points between said parallel circuits being connected to different AC terminals, said switching element includes:

a semiconductor substrate having a pair of main surfaces, wherein said semiconductor substrate comprises:

a first semiconductor region of a first conduction type adjacent to one of the main surfaces of the semiconductor substrate and positioned within the semiconductor substrate;

a second semiconductor region of a second conduction type adjacent to the first semiconductor region and having a carrier concentration lower than a carrier concentration of the first semiconductor region;

a plurality of MOS type trench gates having at least two sorts of intervals thereof extended from the other main surface into the second semiconductor region;

a third semiconductor region of the first conduction type provided between the MOS type trench gates and having a carrier concentration higher than a carrier concentration of the second semiconductor region;

a fourth semiconductor region of the second conduction type provided between the adjacent MOS type trench gates having a narrow interval therebetween to be positioned within the third semiconductor region and to be contacted with the MOS type trench gate and having a carrier concentration higher than a carrier concentration of the third semiconductor region;

a fifth semiconductor region of the second conduction type provided between the adjacent MOS type trench gates having a broad interval therebetween to be positioned within the third semiconductor region and to be contacted with the MOS type trench gates and having a carrier concentration higher than a carrier concentration of the third semiconductor region;

a sixth semiconductor region of the first conduction type provided between said MOS type trench gates having the broad interval and positioned between said third semiconductor region and said fifth semiconductor region and having a carrier concentration higher than the carrier concentration of said third semiconductor region;

a first electrode provided between the adjacent MOS type trench gates having the narrow interval to be contacted with the third and fourth semiconductor regions: and a second electrode contacted with the first semiconductor region, wherein a ratio Y/X of a width X between the adjacent trench gates including the fourth semiconductor region with respect to a width Y between the adjacent trench gates including the fifth semiconductor region is made equal to or larger than two.

* * * * *